(12) United States Patent
Hsiao et al.

(10) Patent No.: US 9,891,501 B2
(45) Date of Patent: Feb. 13, 2018

(54) POLYCRYSTALLINE SILICON THIN FILM TRANSISTOR DEVICE AND METHOD OF FABRICATING THE SAME

(71) Applicant: AU OPTRONICS CORPORATION, Hsin-chu (TW)

(72) Inventors: Hsiang-Yun Hsiao, Hsin-chu (TW); Chia-Kai Chen, Hsin-chu (TW); Shih-Liang Lin, Hsin-chu (TW); Ting-Yu Hsu, Hsin-chu (TW); Pei-Yun Wang, Hsin-chu (TW); Ya-Qin Huang, Hsin-chu (TW); Cheng-Wei Jiang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/264,805

(22) Filed: Sep. 14, 2016

(65) Prior Publication Data
US 2017/0084457 A1    Mar. 23, 2017

(30) Foreign Application Priority Data

Sep. 22, 2015  (TW) .............................. 104131229 A

(51) Int. Cl.
*H01L 27/14*       (2006.01)
*G02F 1/361*       (2006.01)
(Continued)

(52) U.S. Cl.
CPC ...... *G02F 1/3618* (2013.01); *H01L 21/02488* (2013.01); *H01L 21/02532* (2013.01);
(Continued)

(58) Field of Classification Search
CPC ......... H01L 21/02488; H01L 21/02532; H01L 21/02675; H01L 21/2254; H01L 27/1222; H01L 29/66757
(Continued)

(56) References Cited

U.S. PATENT DOCUMENTS 6,818,967 B2    11/2004  Chen
8,937,313 B2 *   1/2015  Chung ................ H01L 27/1218
                                                 257/192
(Continued)

FOREIGN PATENT DOCUMENTS

CN    101404251 A    4/2009
CN    103730364 A    4/2014
(Continued)

OTHER PUBLICATIONS

Office Action issued by (TIPO), Intellectual Property Office, Ministry of Economic Affairs, R. O. C, dated Oct. 12, 2016 for application No. 104131229, Taiwan.

*Primary Examiner* — Tan N Tran
(74) *Attorney, Agent, or Firm* — Tim Tingkang Xia, Esq.; Locke Lord LLP

(57) ABSTRACT

A method of fabricating a polycrystalline silicon thin film transistor device includes the following steps. A substrate is provided, and a buffer layer having dopants is formed on the substrate. An amorphous silicon layer is formed on the buffer layer having the dopants. A thermal process is performed to convert the amorphous silicon layer into a polycrystalline silicon layer by means of polycrystalization, and to simultaneously out-diffuse a portion of the dopants in the buffer layer into the polycrystalline silicon layer for adjusting a threshold voltage. The polycrystalline silicon layer is patterned to form an active layer. A gate insulating layer is formed on the active layer. A gate electrode is formed on the
(Continued)

gate insulating layer. A source doped region and a drain doped region are formed in the active layer.

19 Claims, 14 Drawing Sheets

(51) Int. Cl.
*H01L 29/786* (2006.01)
*H01L 21/02* (2006.01)
*H01L 29/66* (2006.01)
*H01L 27/12* (2006.01)

(52) U.S. Cl.
CPC .... *H01L 21/02675* (2013.01); *H01L 27/1222* (2013.01); *H01L 27/1281* (2013.01); *H01L 29/66757* (2013.01); *H01L 29/78618* (2013.01); *H01L 29/78675* (2013.01); *H01L 29/78696* (2013.01)

(58) Field of Classification Search
USPC ..................................... 257/59, 72, 258, 432
See application file for complete search history.

(56) References Cited

U.S. PATENT DOCUMENTS

| | | | |
|---|---|---|---|
| 2004/0155245 A1 | 8/2004 | Okumura | |
| 2006/0093807 A1* | 5/2006 | Chang | .................... B32B 3/085 |
| | | | 428/313.3 |
| 2012/0049199 A1* | 3/2012 | Chung | ............. H01L 21/02422 |
| | | | 257/72 |
| 2014/0315357 A1 | 10/2014 | Tan et al. | |

FOREIGN PATENT DOCUMENTS

| | | |
|---|---|---|
| CN | 104538357 A | 4/2015 |
| TW | 201209890 A | 3/2012 |
| TW | 201523955 A | 6/2015 |

* cited by examiner

POLYCRYSTALLINE SILICON THIN FILM TRANSISTOR DEVICE AND METHOD OF FABRICATING THE SAME

CROSS-REFERENCE TO RELATED APPLICATION

This non-provisional application claims priority to and benefit of, under 35 U.S.C. § 119(a), Patent Application No. 104131229 filed in Taiwan R.O.C. on Sep. 22, 2015, the entire contents of which are hereby incorporated by reference.

BACKGROUND

Technical Field

The present invention relates to a polycrystalline silicon thin film transistor device and a method of fabricating the same, and more particularly to a polycrystalline silicon thin film transistor device having high electron mobility and a method of fabricating the same.

Related Art

A low temperature polycrystalline silicon (LTPS) thin film transistor device has a characteristic of relatively high electron mobility, and therefore theoretically has better electrical performance compared with an amorphous silicon thin film transistor device. However, because a process of an LTPS thin film transistor device is relatively complex, and the LTPS thin film transistor device needs more photolithography and etching processes (PEP) than an amorphous silicon thin film transistor device does, not only a fabrication cost is relatively high, but also a yield is also reduced.

SUMMARY

An objective of the present invention is to provide a polycrystalline silicon thin film transistor device and a method of fabricating the same, so as to simplify process steps, reduce a fabrication cost, and improve electron mobility and device characteristics.

An embodiment of the present invention provides a method of fabricating a polycrystalline silicon thin film transistor device, including the following steps. A substrate is provided, and a buffer layer having dopants is formed on the substrate. An amorphous silicon layer is formed on the buffer layer having the dopants. A thermal process is performed to convert the amorphous silicon layer into a polycrystalline silicon layer by means of polycrystalization, and to simultaneously out-diffuse a portion of the dopants in the buffer layer into the polycrystalline silicon layer for adjusting a threshold voltage. The polycrystalline silicon layer is patterned to form an active layer. A gate insulating layer is formed on the active layer. A gate electrode is formed on the gate insulating layer. A source doped region and a drain doped region are formed in the active layer.

Another embodiment of the present invention provides a polycrystalline silicon thin film transistor device, disposed on a substrate. The polycrystalline silicon thin film transistor device includes a buffer layer, a polycrystalline silicon layer, a gate insulating layer, and a gate electrode. The buffer layer is disposed on the substrate, and the buffer layer has dopants. The polycrystalline silicon layer is disposed on the buffer layer, where the polycrystalline silicon layer includes a channel, a source doped region, and a drain doped region, and the source doped region and the drain doped region are respectively located on two sides of the channel. The gate insulating layer is disposed on the polycrystalline silicon layer. The gate electrode is disposed on the gate insulating layer and corresponds to the channel of the polycrystalline silicon layer.

DETAILED DESCRIPTION

To enable a person skilled in the art of the present invention to further understand the present invention, the constituent content and the efficacy to be achieved of the present invention are described below in detail by using preferred embodiments of the present invention with reference to the accompanying drawings.

Figure 1:
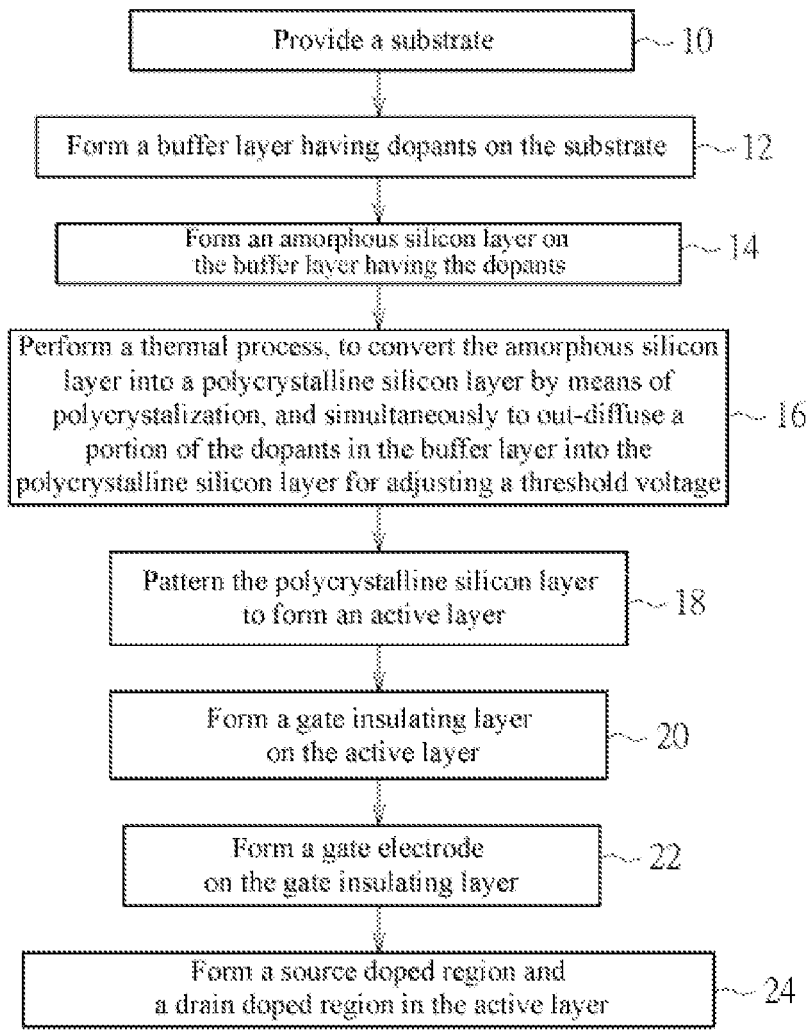
FIG. 1 is a flowchart of a method of fabricating a polycrystalline silicon thin film transistor device according to the present invention.

Refer to FIG. 1. FIG. 1 is a flowchart of a method of fabricating a polycrystalline silicon thin film transistor device according to the present invention. As shown in FIG. 1, the method of fabricating a polycrystalline silicon thin film transistor device of the present invention includes the following steps.

Step 10: Provide a substrate.

Step 12: Form a buffer layer having dopants on the substrate.

Step 14: Form an amorphous silicon layer on the buffer layer having the dopants.

Step 16: Perform a thermal process, to convert the amorphous silicon layer into a polycrystalline silicon layer by means of polycrystalization, and simultaneously to out-diffuse a portion of the dopants in the buffer layer into the polycrystalline silicon layer for adjusting a threshold voltage.

Step 18: Pattern the polycrystalline silicon layer to form an active layer.

Step 20: Form a gate insulating layer on the active layer.

Step 22: Form a gate electrode on the gate insulating layer.

Step 24: Form a source doped region and a drain doped region in the active layer.

Figure 2:
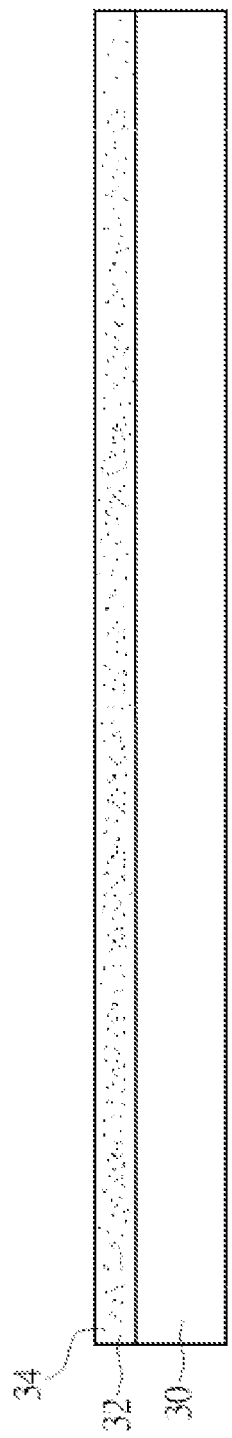
FIG. 2 to FIG. 8 are schematic diagrams of a method of fabricating a polycrystalline silicon thin film transistor device according to a first embodiment of the present invention.

Continue to refer to FIG. 2 to FIG. 8, and refer to FIG. 1 together. FIG. 2 to FIG. 8 are schematic diagrams of a method of fabricating a polycrystalline silicon thin film transistor device according to a first embodiment of the present invention. As shown in FIG. 2, a substrate 30 is provided first. The substrate 30 may include a transparent substrate such as a glass substrate, a plastic substrate, a quartz substrate, a sapphire substrate or another suitable substrate, and a rigid substrate or a flexible substrate may be selected for the substrate 30. Next, a buffer layer 32 having dopants 34 is formed on the substrate 30. In this embodiment, the buffer layer 32 is a single-layer-structure buffer layer, and the material of the buffer layer 32 may include an inorganic insulating material such as silicon oxide, but is not limited thereto. The material of the buffer layer 32 may also include silicon nitride, silicon oxynitride or another suitable inorganic or organic insulating material. In another embodiment, the buffer layer 32 may be a multi-layered-stack-structure buffer layer. The buffer layer 32 may be formed by using a deposition process such as a chemical vapor deposition (CVD) process, a physical vapor deposition (PVD) or another suitable deposition process. In addition, the method in this embodiment may include introducing a gas that contains the dopants 34 during a deposition process for forming the buffer layer 32, so as to form the dopants 34 in the buffer layer 32. That is, the buffer layer 32 and the dopants 34 may be formed together in a same reaction chamber. The dopants 34 in the buffer layer 32 may include P-type dopants such as boron ions or N-type dopants such as phosphor ions. In this case, the gas that is introduced in the reaction chamber may be gas that contains boron ions or phosphor ions, but is not limited thereto. In addition, in a variant embodiment, the buffer layer 32 and the dopants 34 may be fabricated separately. That is, a deposition process may be performed first to deposit the buffer layer 32 on the substrate 30, and an ion implantation process is then performed to form the dopants 34 in the buffer layer 32. In this embodiment, a doping concentration of the dopants 34 in the buffer layer 32 may be, for example, between $8 \times 10^{14}$ atom/cm$^3$ to $4 \times 10^{15}$ atom/cm$^3$, but is not limited thereto. The doping concentration of the dopants 34 may be changed according to a threshold voltage of a polycrystalline silicon thin film transistor device and a different thermal process. In addition, the dopants 34 may be evenly distributed within the buffer layer 32, or a large portion of the dopants 34 are distributed within an area near the surface of the buffer layer 32, or the dopants 34 are distributed on a gradient.

Figure 3:
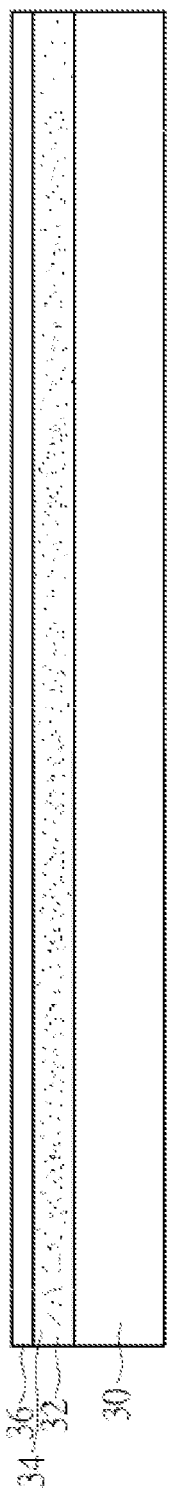

As shown in FIG. 3, an amorphous silicon layer 36 is then formed on the buffer layer 32 having the dopants 34. The amorphous silicon layer 36 may be formed by using a deposition process such as a CVD process, a plasma enhanced chemical vapor deposition (PECVD) process or another suitable deposition process.

Figure 4:
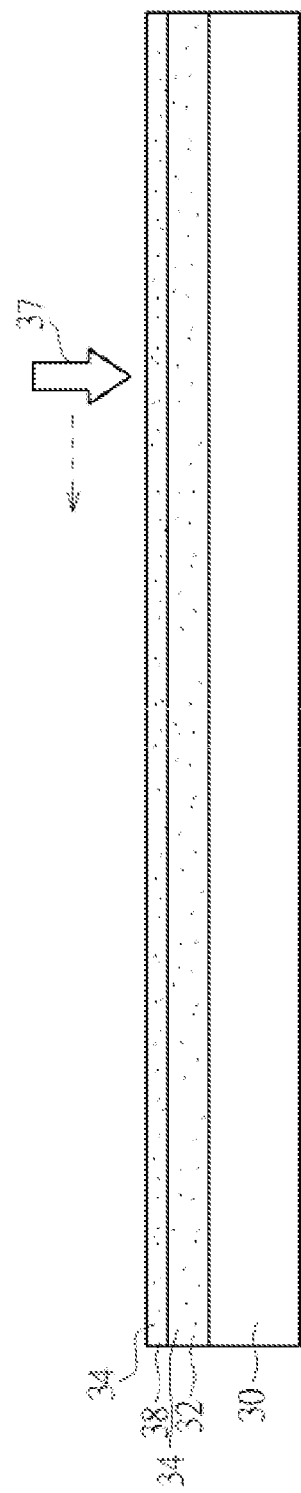

As shown in FIG. 4, a thermal process is performed subsequently, to convert the amorphous silicon layer 36 into a polycrystalline silicon layer 38 by means of polycrystalization, and simultaneously to out-diffuse a portion of the dopants 34 in the buffer layer 32 to the polycrystalline silicon layer 38 for adjusting the threshold voltage. The method in this embodiment may be a method of fabricating an LTPS thin film transistor device, where thermal process may include excimer laser annealing (ELA) process, in which a laser beam 37 is used to perform polycrystalization sequentially on the amorphous silicon layer 36 at different locations in a scan manner, so as to rearrange amorphous silicon into polycrystalline silicon. In a variant embodiment, thermal process may also include a solid phase crystalliza- tion (SPC) process or another suitable thermal process. In the ELA process, the buffer layer 32 is also radiated by the laser beam 37 and is heated, so that a portion of the dopants 34 is diffused into the polycrystalline silicon layer 38 to form doping of the polycrystalline silicon layer 38, thereby achieving an effect of adjusting a threshold voltage. When the dopants 34 in the buffer layer 32 is diffused to the polycrystalline silicon layer 38, the buffer layer 32 may have a rough surface, and the buffer layer 32 may be formed into a porous buffer layer. In this case, after thermal process, the doping concentration of the dopants 34 in the buffer layer 32 is less than the doping concentration of the dopants 34 in the buffer layer 32 before thermal process. In this case, after radiation by the laser beam 37, thermal energy accumulates in the rough surface and pores of the buffer layer 32 to increase a grain boundary size of the polycrystalline silicon in the polycrystalline silicon layer 38 (that is, a grain size of the polycrystalline silicon increases) to optimize seed growth. That is, thermal process in this embodiment may simultaneously perform polycrystalization on the amorphous silicon layer 36, and together perform doping on the polycrystalline silicon layer 38 for adjusting a threshold voltage. In addition, compared with a manner of directly performing doping on the polycrystalline silicon layer 38 by using an ion implantation process and a manner of performing polycrystalization on the amorphous silicon layer 36 by using a thermal process, in the approach of performing doping on the polycrystalline silicon layer 38 by using the dopants 34 in the buffer layer 32 in this embodiment, only one thermal process is needed to achieve an effect of adjusting a threshold voltage and performing polycrystalization, and the pores in the buffer layer 32 may further exert an effect of accumulating thermal energy to increase a grain boundary size of polycrystalline silicon in the polycrystalline silicon layer 38 to optimize seed growth, thereby helping improve electron mobility.

In addition, to further improve a crystallization capability of an ELA process, in this embodiment, the thickness and a refractive index of the buffer layer 32 and a wavelength of and excimer laser may meet the relationship in the following Formula (1).

$$2nd = m\lambda \qquad (1)$$

where n is the refractive index of the buffer layer 32, d is the thickness of the buffer layer 32, $\lambda$ is the wavelength of the excimer laser, and m is positive integer.

Under the condition that the following Formula (1) is met, the excimer laser may produce resonance in the buffer layer 32 to amplify energy, thereby improving a crystallization status of polycrystalline silicon and increase the grain boundary size, so that electron mobility and device characteristics are further improved.

Before thermal process is performed, in the method in this embodiment, a dehydrogenation process may be selectively performed first on the amorphous silicon layer 36, and during the dehydrogenation process, a portion of the dopants 34 in the buffer layer 32 may be simultaneously diffused into the amorphous silicon layer 36.

Figure 5:
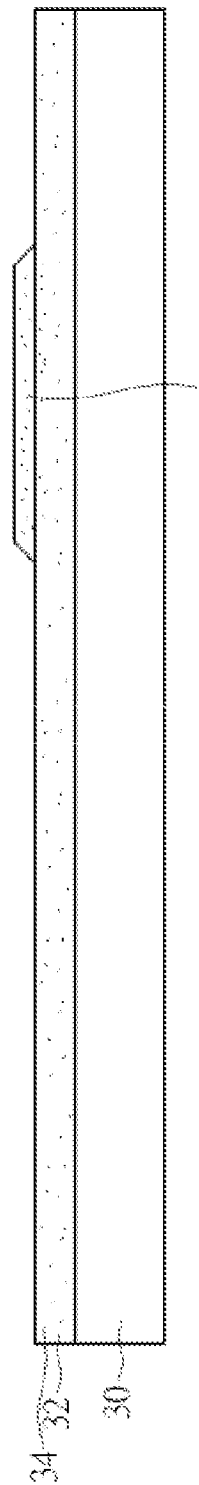

As shown in FIG. 5, next, the polycrystalline silicon layer 38 is patterned, to remove a portion of the polycrystalline silicon layer 38 to form an active layer 381. The patterning process may be a PEP, but is not limited thereto.

Figure 6:
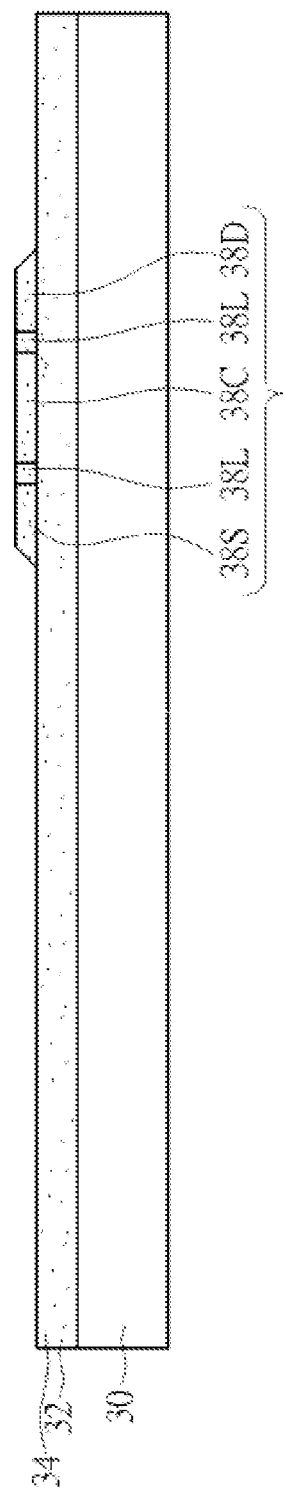

As shown in FIG. 6, a channel 38C, a source doped region 38S, and a drain doped region 38D are formed in the active layer 381, where the source doped region 38S and the drain doped region 38D are respectively located on two sides of the channel 38C. In addition, a soft doped region 38L may be selectively formed between the channel 38C and the source doped region 38S and between the channel 38C and the drain doped region 38D between respectively, where the doping concentrations in the source doped region 38S and the drain doped region 38D are greater than the doping concentration in the soft doped region 38L, and the doping concentration in the channel 38C is less than that in the source doped region 38S, the drain doped region 38D, and the soft doped region 38L.

In this embodiment, the source doped region 38S, the drain doped region 38D, and the soft doped region 38L may be formed by using an ion implantation process in combination with a mask (not shown) such as a resist pattern. For example, the resist pattern may be first formed on the surface of the active layer 381, where the resist pattern covers the channel 38C and a predetermined region to form the soft doped region 38L and exposes predetermined regions to form the source doped region 38S and the drain doped region 38D. Next, the resist pattern is used as a mask to perform the ion implantation process on the exposed active layer 381 to form the source doped region 38S and the drain doped region 38D. Subsequently, a portion of the resist pattern is removed by using, for example, an ashing process, to further expose the predetermined region to form the soft doped region 38L, and the reduced resist pattern is then used as a mask to perform the ion implantation process again to form the soft doped region 38L. Eventually, the remaining resist pattern is removed. The manner of fabricating the source doped region 38S, the drain doped region 38D, and the soft doped region 38L of the present invention is not limited to the foregoing embodiment. In a variant embodiment, the source doped region 38S and the drain doped region 38D may be formed by using an ion implantation process in combination with a mask, and the soft doped region 38L may be formed by using another ion implantation process in combination with another mask. Alternatively, the source doped region 38S, the drain doped region 38D, and the soft doped region 38L may be fabricated by using a subsequently formed gate electrode as a mask. Subsequently, the method in this embodiment may include performing a hydrogenation process on the polycrystalline silicon layer 38, to repair defects of the polycrystalline silicon layer 38. In addition, the method in this embodiment may also include performing an activation process such as a thermal annealing process or a laser annealing process on the source doped region 38S and the drain doped region 38D, to reduce resistance values of the source doped region 38S and the drain doped region 38D.

Figure 7:
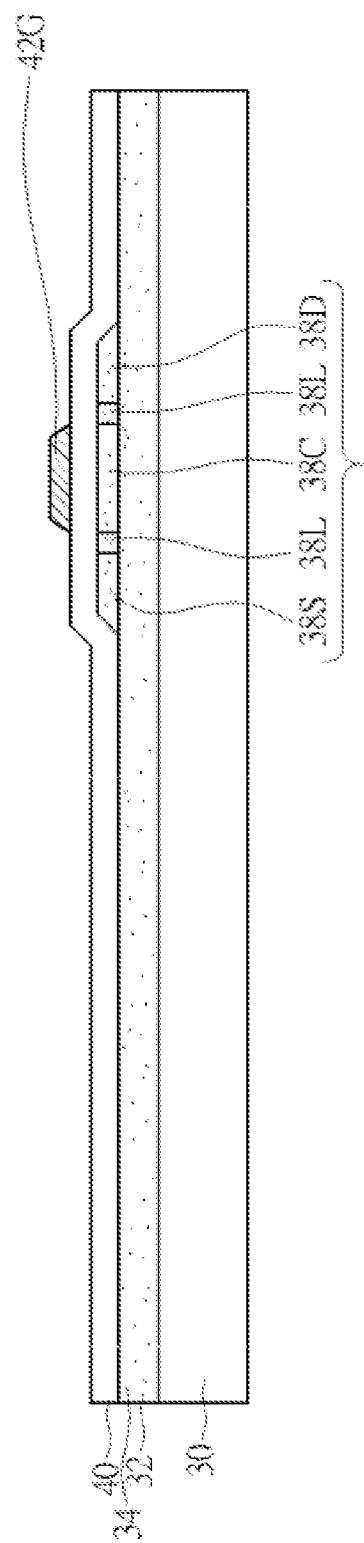

As shown in FIG. 7, next, a gate insulating layer 40 is formed on the active layer 381. The material of the gate insulating layer 40 may be an inorganic material such as silicon oxide, silicon nitride or silicon oxynitride, but is not limited thereto. Subsequently, a gate electrode 42G is formed on the gate insulating layer 40, where the gate electrode 42G and the channel 38C may overlap in a perpendicular projection direction. In this embodiment, the material of the gate electrode 42G may include a metal or an alloy, for example, metal such as gold, silver, copper, aluminum, titanium, and molybdenum or an alloy thereof, or another suitable conductive material.

Figure 8:
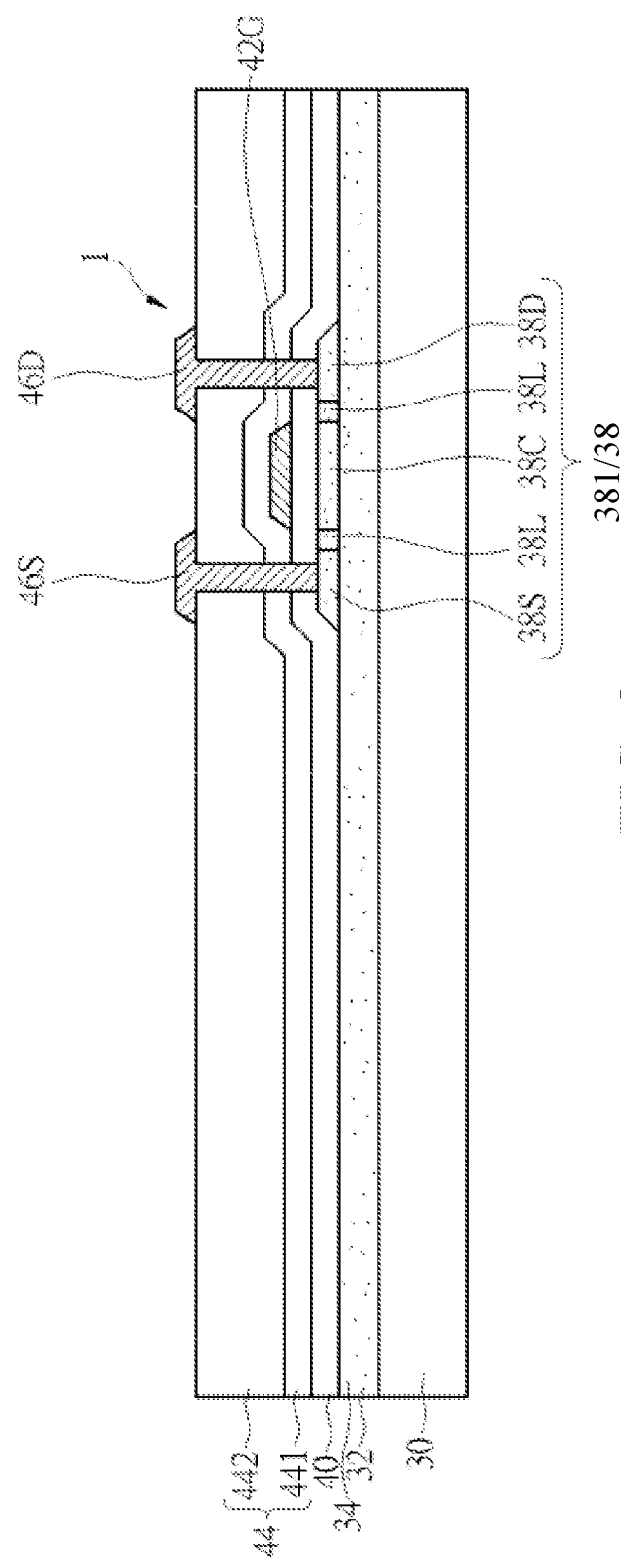

As shown in FIG. 8, next, an interlevel dielectric layer 44 is formed on the gate electrode 42G, and the interlevel dielectric layer 44 and the gate insulating layer 40 are patterned to expose the source doped region 38S and the drain doped region 38D. The patterning process may be a PEP, but is not limited thereto. In this embodiment, the interlevel dielectric layer 44 may be a multi-layered-stack-structure interlevel dielectric layer, and may include, for example: a first interlevel dielectric layer 441 is located on the gate electrode 42G, and a second interlevel dielectric layer 442 is stacked on the first interlevel dielectric layer 441, where the first interlevel dielectric layer 441 may be an inorganic dielectric layer such as a silicon oxide layer, a silicon nitride layer or a silicon oxynitride layer, but is not limited thereto; and the second interlevel dielectric layer 442 may be an organic dielectric layer, but is not limited thereto. In a variant embodiment, the interlevel dielectric layer 44 may also be single-layer structure layer. Subsequently, a source electrode 46S and a drain electrode 46D are formed on the interlevel dielectric layer 44, where the source electrode 46S and the source doped region 38S are electrically connected, and the drain electrode 46D and the drain doped region 38D are electrically connected. The material of the source electrode 46S and the drain electrode 46D may include a metal or an alloy, for example, a metal such as gold, silver, copper, aluminum, titanium, and molybdenum or an alloy thereof, or another suitable conductive material. At this point, the polycrystalline silicon thin film transistor device 1 in this embodiment may be fabricated. The interlevel dielectric layer 44 in this embodiment may be a multi-layered-stack-structure design, and may add an effect of resonance in a laser annealing process, so that a grain boundary size can be increased to optimize seed growth, thereby improving electron mobility and device characteristics.

Figure 9:
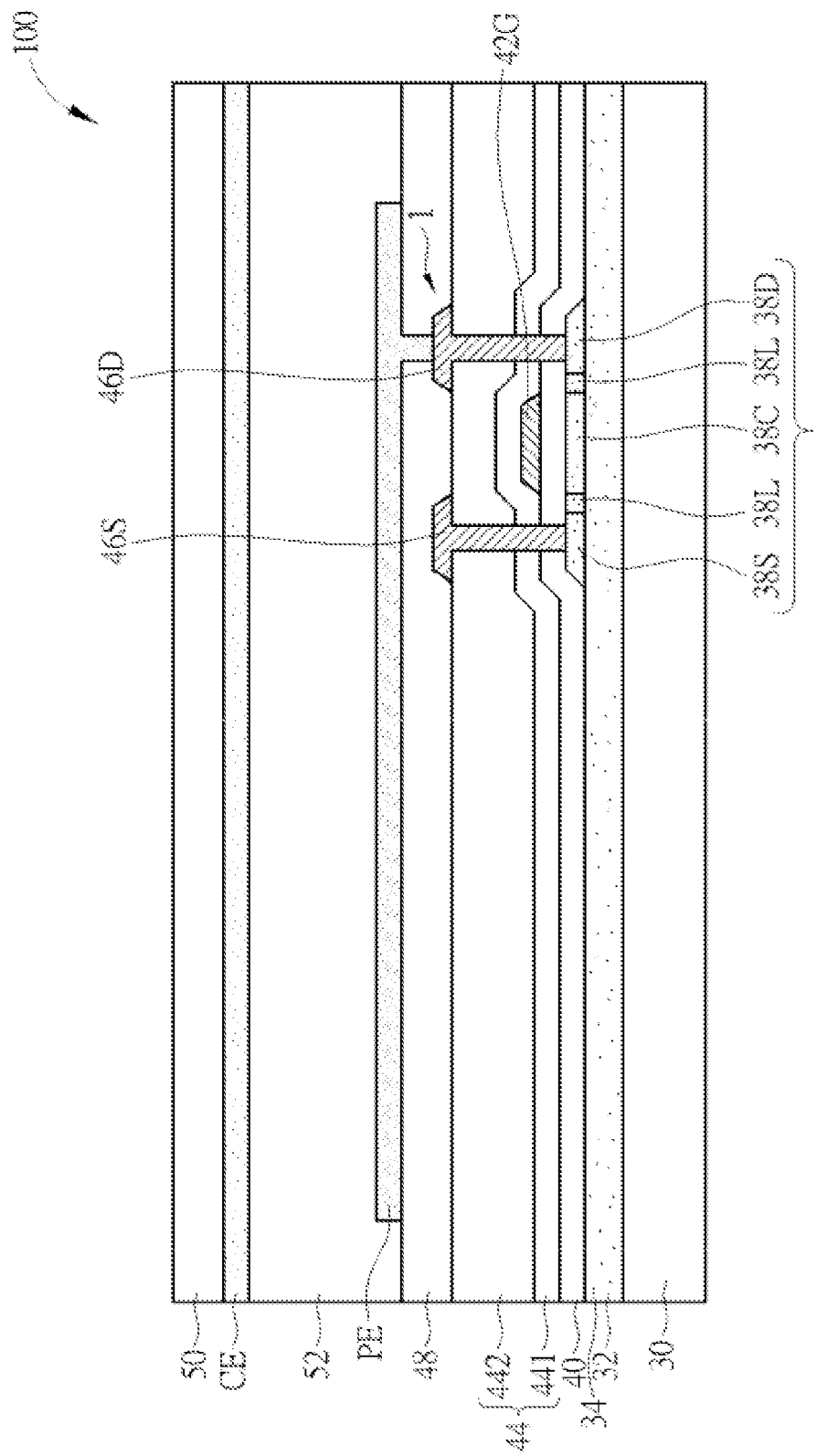
FIG. 9 is a schematic diagram of fabricating a display panel according to an embodiment of the present invention.

The polycrystalline silicon thin film transistor device 1 in this embodiment may be applied to a display panel such as a liquid crystal display panel, an electroluminescent display panel or a display panel of any other type, a touch panel or any electronic apparatus or photoelectric apparatus, and is used as a switch device or a driving device. Refer to FIG. 9 together with FIG. 8. FIG. 9 is a schematic diagram of fabricating a display panel according to an embodiment of the present invention. As shown in FIG. 9, next, a passivation layer 48 and a pixel electrode PE are sequentially formed on the polycrystalline silicon thin film transistor device 1. The passivation layer 48 may partially expose the drain electrode 46D, and the pixel electrode PE and the drain electrode 46D are electrically connected. Next, another substrate 50 is provided, and a common electrode CE is formed on the substrate 50. Next, the substrate 30 and the substrate 50 are combined, and a display medium layer 52 is formed between the substrate 30 and the substrate 50, so as to form a display panel 100 in this embodiment. The display panel 100 in this embodiment is, for example, a liquid crystal display panel, and therefore, the display medium layer 52 may include a liquid crystal layer, but is not limited thereto. In a variant embodiment, the display panel may also be electroluminescent display panel such as an organic light-emitting diode display panel, and the display medium layer 52 may be an electroluminescent layer or another suitable non-self-luminous display medium layer or self-emission optical display medium layer. The display panel 100 in this embodiment is, for example, vertical-field-driven liquid crystal display panel, for example, a twisted nematic (TN) liquid crystal display panel or a vertical alignment (VA) liquid crystal display panel, but is not limited thereto. For example, the display panel of the present invention may also be a horizontal-field-driven liquid crystal display panel such as an in-plane switching (IPS) liquid crystal display panel, a fringe field switching (FFS) liquid crystal display panel or a display panel of another type. In a variant embodiment, the common electrode CE may also be formed on the substrate 30 and is located on a same plane as the pixel electrode PE, for an application as the IPS liquid crystal display panel. In another variant embodiment, the common electrode CE may also be formed on the substrate 30 but is located on a different plane from the pixel electrode PE, for an application as the FFS liquid crystal display panel.

As can be seen from the above, in the method of fabricating a polycrystalline silicon thin film transistor device of the present invention, an amorphous silicon layer can be converted into a polycrystalline silicon layer by using a single thermal process, and simultaneously dopants in a buffer layer are diffused into the polycrystalline silicon layer for adjusting a threshold voltage, so that process steps can be simplified and a fabrication cost can be reduced. In addition, when the dopants in the buffer layer are diffused into the polycrystalline silicon layer, the buffer layer is formed into a porous buffer layer, so that in thermal process, thermal energy can accumulate in pores to increase a grain boundary size of polycrystalline silicon in the polycrystalline silicon layer to optimize seed growth, thereby improving electron mobility and device characteristics.

The polycrystalline silicon thin film transistor device and the method of fabricating the same of the present invention are not limited to the foregoing embodiments. The polycrystalline silicon thin film transistor device and the method of fabricating the same in other preferred embodiments of the present invention are sequentially introduced below. To facilitate comparison of differences between the embodiments and to simplify description, in the following embodiments, the same symbols are used to represent the same devices, and the differences between the embodiments are mainly described, and repetitive parts are no longer elaborated.

Figure 10:
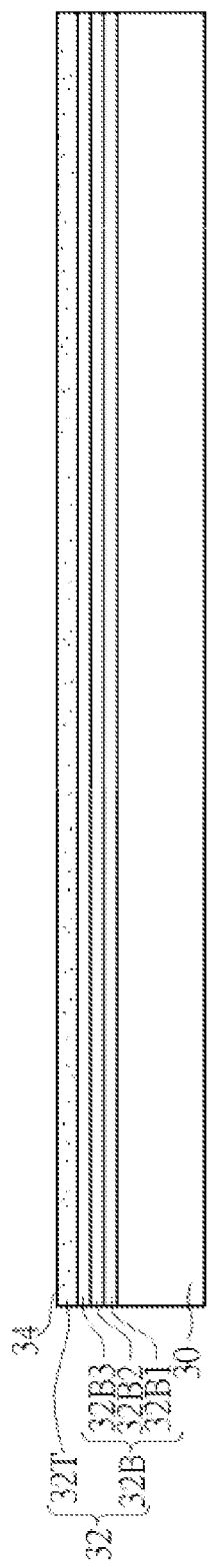
FIG. 10 and FIG. 11 are schematic diagrams of a method of fabricating a polycrystalline silicon thin film transistor device according to a second embodiment of the present invention.
Figure 11:
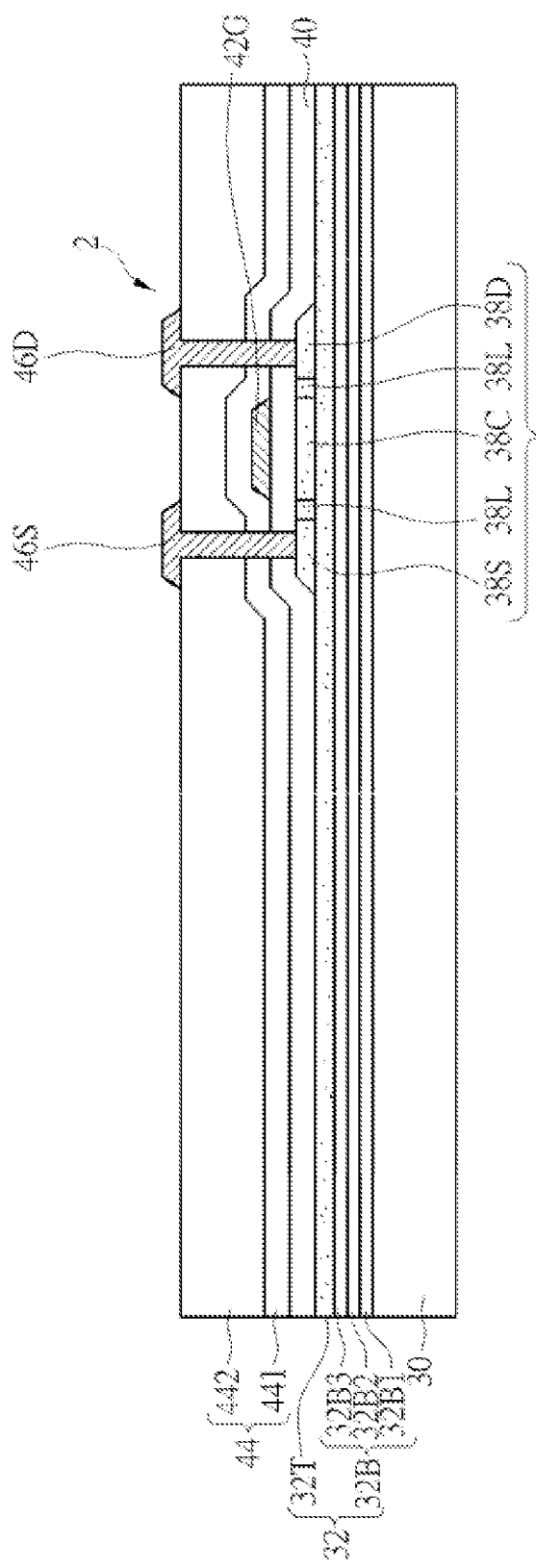

Continue to refer to FIG. 10 and FIG. 11, and refer to FIG. 1 together. FIG. 10 and FIG. 11 are schematic diagrams of a method of fabricating a polycrystalline silicon thin film transistor device according to a second embodiment of the present invention. As shown in FIG. 10, in this embodiment, the buffer layer 32 is a multi-layered-stack-structure buffer layer, and includes at least one bottom buffer layer 32B located on the substrate 30 and a top buffer layer 32T located on the bottom buffer layer 32B. For example, the bottom buffer layer 32B of the buffer layer 32 in this embodiment may include a first bottom buffer layer 32B1, a second bottom buffer layer 32B2, and a third bottom buffer layer 32B3, which are sequentially formed on the substrate 30, and the top buffer layer 32T may be formed on the third bottom buffer layer 32B3. In this embodiment, the first bottom buffer layer 32B1, the second bottom buffer layer 32B2, the third bottom buffer layer 32B3, and the top buffer layer 32T may be sequentially stacked film layers of different materials. For example, the material of the first bottom buffer layer 32B1 and the third bottom buffer layer 32B3 may be silicon nitride, and the material of the second bottom buffer layer 32B2 and the top buffer layer 32T may be silicon oxide, thereby increasing and the adhesiveness of the substrate 30 and reduce stress. In addition, the thickness of the first bottom buffer layer 32B1, the second bottom buffer layer 32B2, the third bottom buffer layer 32B3, and the top buffer layer 32T may be adjusted according to the adhesiveness, stress, and another consideration. In an implementation aspect, the thickness of the second bottom buffer layer 32B2 and the top buffer layer 32T may be greater than that of the first bottom buffer layer 32B1 and the third bottom buffer layer 32B3. For example, the thickness of the second bottom buffer layer 32B2 or the top buffer layer 32T may be a multiple of the thickness of the first bottom buffer layer 32B1 or the third bottom buffer layer 32B3; however, the present invention is not limited thereto.

In this embodiment, the dopants 34 may be formed on only the top buffer layer 32T of the multi-layered-stack-structure buffer layer, where a manner of forming the dopants 34 in the top buffer layer 32T may be as described in the foregoing embodiments. For example, a gas that contains the dopants 34 is simultaneously introduced in a deposition process of forming the top buffer layer 32T, so as to form the dopants 34 in the top buffer layer 32T, whereas the dopants 34 are not formed in the bottom buffer layer 32B. Alternatively, the top buffer layer 32T is formed, and an ion implantation process is then performed to form the dopants 34 in the top buffer layer 32T, whereas the dopants 34 are not formed in the bottom buffer layer 32B. In a variant embodiment, in addition to being formed in the top buffer layer 32T, the dopants 34 may also be formed in the bottom buffer layer 32B.

As shown in FIG. 11, the process in FIG. 3 to FIG. 8 in the first embodiment is then performed, so that a polycrystalline silicon thin film transistor device 2 in this embodiment can be fabricated.

The polycrystalline silicon thin film transistor device 2 in this embodiment may be applied to a display panel such as a liquid crystal display panel, an electroluminescent display panel or a display panel of any other type, a touch panel or any electronic apparatus or photoelectric apparatus, and is used as a switch device or a driving device, as shown in the foregoing embodiment, which is no longer elaborated herein.

Figure 12:
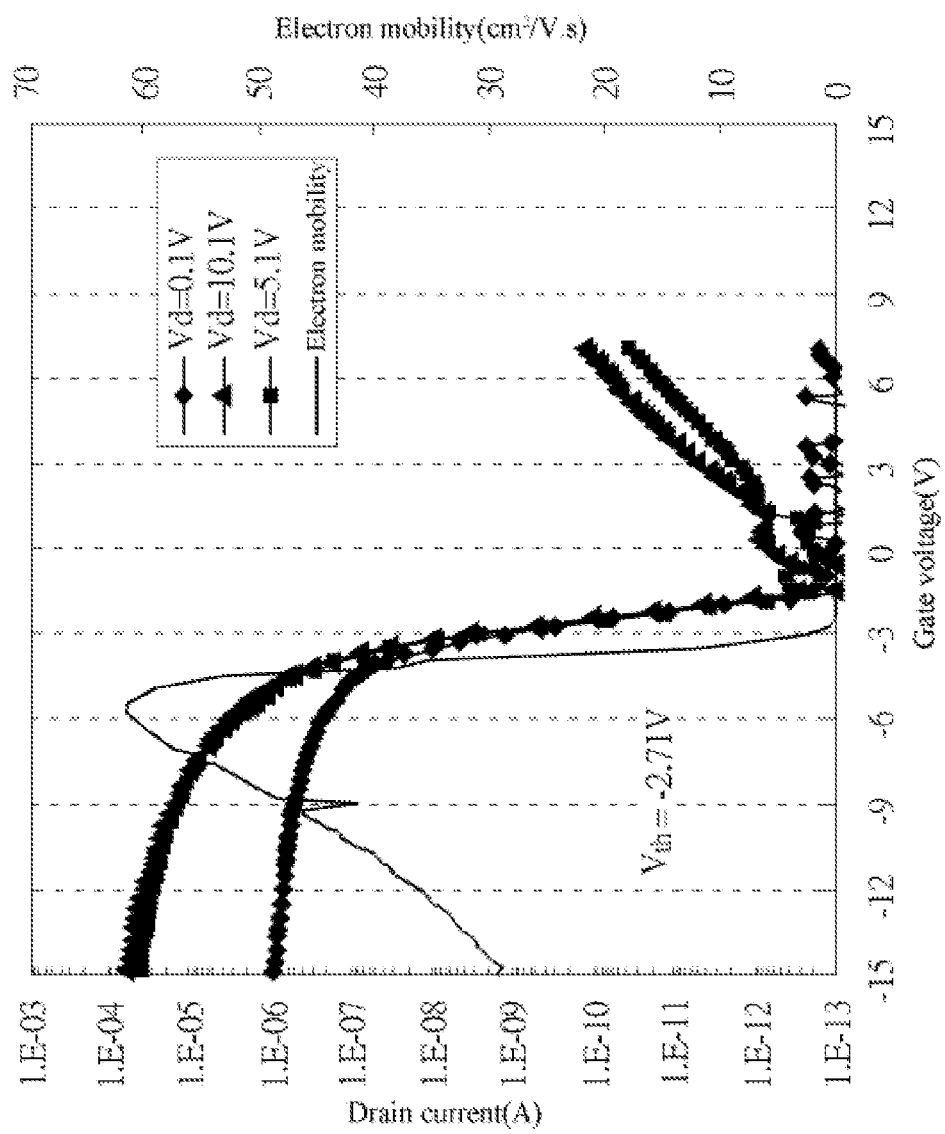
FIG. 12 is a drain current-gate voltage relationship diagram and an electron mobility-gate voltage relationship diagram of a polycrystalline silicon thin film transistor device according to a comparative embodiment.
Figure 13:
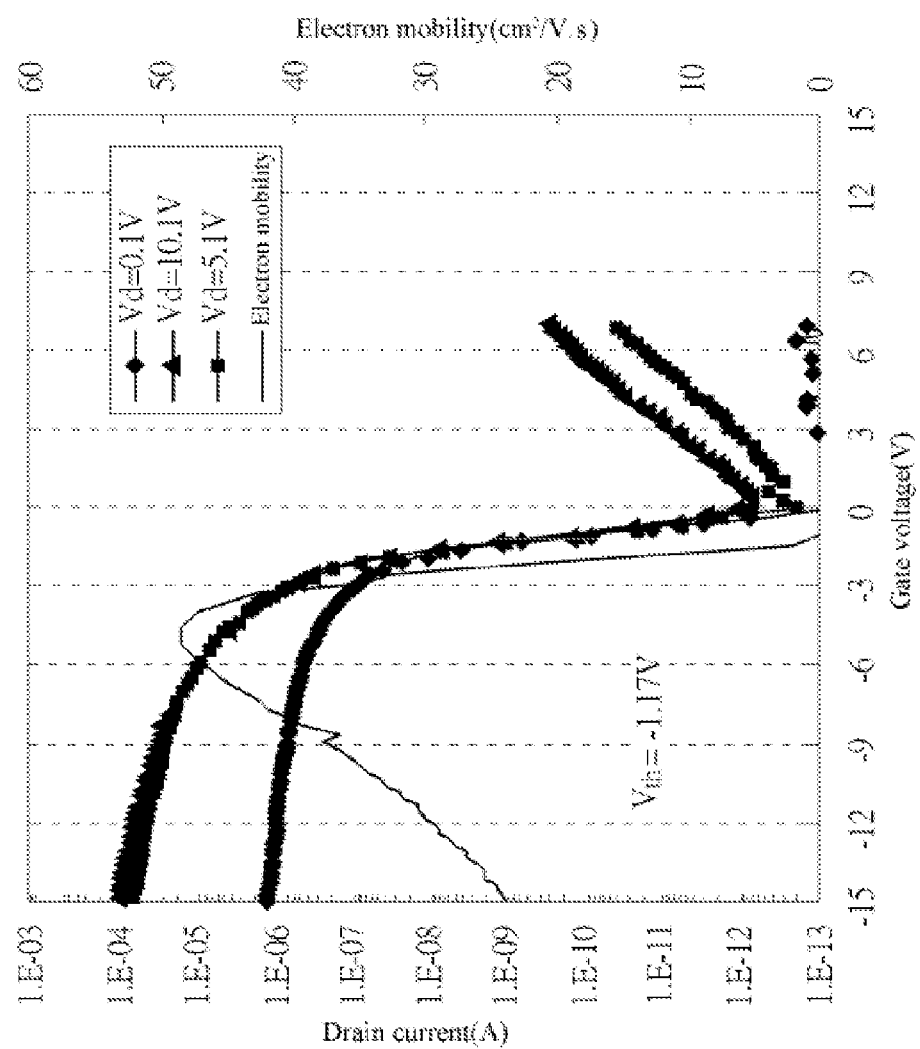
FIG. 13 is a drain current-gate voltage relationship diagram and an electron mobility-gate voltage relationship diagram of a polycrystalline silicon thin film transistor device in a first sample according to the present invention.
Figure 14:
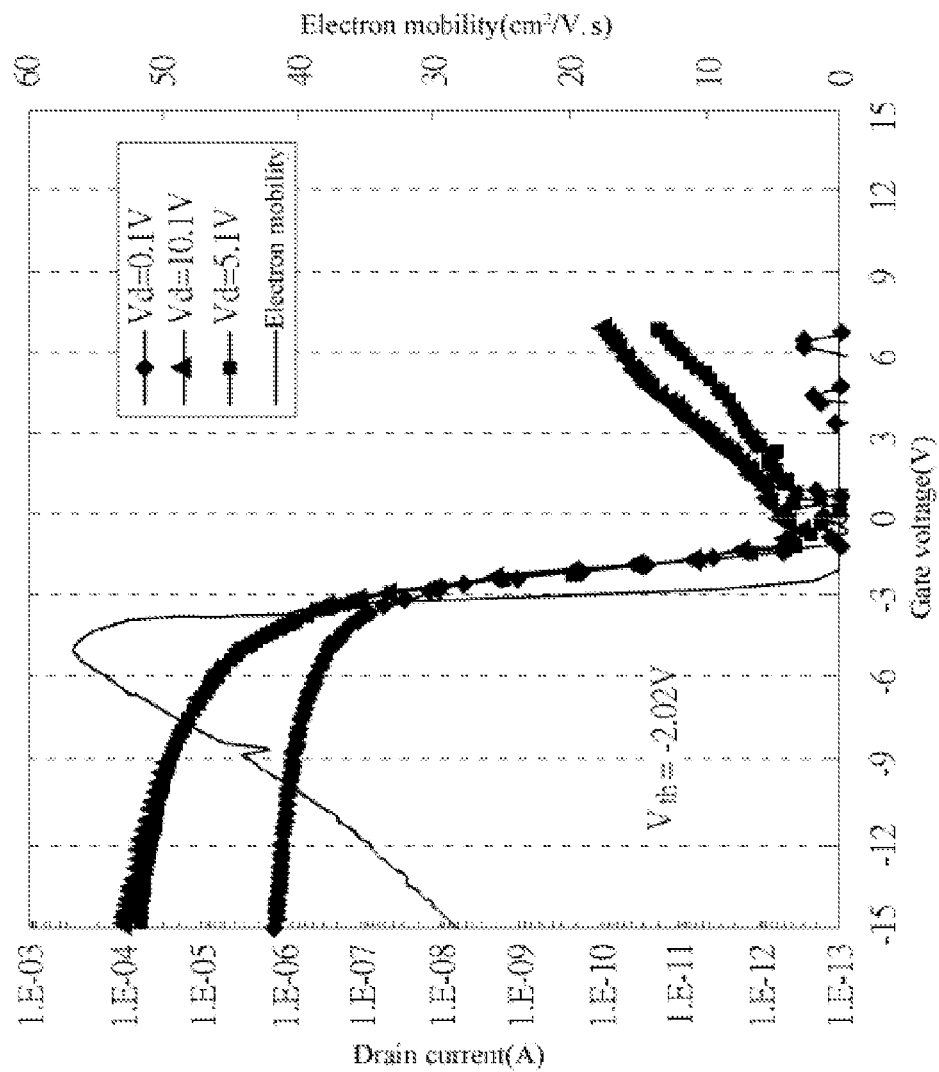
FIG. 14 is a drain current-gate voltage relationship diagram and an electron mobility-gate voltage relationship diagram of a polycrystalline silicon thin film transistor device in a second sample according to the present invention.

Refer to FIG. 12 to FIG. 14. FIG. 12 is a drain current-gate voltage relationship diagram and an electron mobility-gate voltage relationship diagram of a polycrystalline silicon thin film transistor device according to a comparative embodiment, FIG. 13 is a drain current-gate voltage relationship diagram and an electron mobility-gate voltage relationship diagram of the polycrystalline silicon thin film transistor device in a first sample of the present invention, and FIG. 14 is a drain current-gate voltage relationship diagram and an electron mobility-gate voltage relationship diagram of the polycrystalline silicon thin film transistor device in a second sample of the present invention. In the method in the comparative embodiment (FIG. 12), in the polycrystalline silicon thin film transistor device, a threshold voltage is directly adjusted for a polycrystalline silicon layer by using an ion implantation process, there is no dopant in a buffer layer, and tests are performed respectively in conditions in which a drain voltage Vd is 0.1 V, 5.1 V, and 10.1 V. In the method of the present invention (FIG. 13 and FIG. 14), the ion implantation process is first performed on the buffer layer, and a thermal process is then performed to perform polycrystalization and simultaneously to diffuse dopants into the polycrystalline silicon layer of polycrystalline silicon thin film transistor device, and tests are performed respectively in conditions in which a drain voltage Vd is 0.1 V, 5.1 V, and 10.1 V. In FIG. 13, the energy in the ion implantation process in the first sample is 60 key, the dopants are boron ions, and the doping concentration is $5*10^{13}$ atoms/cm$^3$. In FIG. 14, the energy in the ion implantation process in the second sample is 60 kev, the dopants are phosphor ions, and the doping concentration is $2*10^{14}$ atoms/cm$^3$. As shown in FIG. 12, the threshold voltage (Vth) of the polycrystalline silicon thin film transistor device in the comparative embodiment is approximately −2.71 V. By comparison, as shown in FIG. 13, the threshold voltage (Vth) of the polycrystalline silicon thin film transistor device in the first sample is approximately −1.17 V. As shown in FIG. 14, the threshold voltage (Vth) of the polycrystalline silicon thin film transistor device in the second sample is approximately −2.02 V. As can be seen from the above experimental data, the approach in which the dopants are first formed in the buffer layer and a thermal process is then performed to perform polycrystalization and to simultaneously diffuse the dopants into the polycrystalline silicon layer of the polycrystalline silicon thin film transistor device actually can effectively adjust the threshold voltage into a predetermined range.

In addition, the experiment conducted for a grain boundary size of the polycrystalline silicon layer in the present invention also shows that the approach in which the dopants are first formed in the buffer layer and a thermal process is then performed to perform polycrystalization and to simultaneously diffuse the dopants into the polycrystalline silicon layer of the polycrystalline silicon thin film transistor device can effectively increase the grain boundary size (that is, increase the grain size). Refer to Table 1, Table 1 shows grain boundary sizes in a comparative embodiment and an embodiment of the present invention, where in the comparative embodiment, a grain boundary size is obtained through actual measurement in a condition in which there is no dopant in the buffer layer, whereas in this embodiment, a grain boundary size is obtained through actual measurement in a condition in which argon (Ar) ions are doped in the buffer layer.

TABLE 1

|  | Comparative Embodiment | This Embodiment |
| --- | --- | --- |
| Grain boundary size | 0.3098 micrometer | 0.3432 micrometer |

As can be seen from the result in Table 1, in a condition in which there is no dopant in the buffer layer, the grain boundary size in the comparative embodiment is approximately 0.3098 micrometer, whereas in the condition in which dopants are formed in the buffer layer, the grain boundary size in this embodiment is approximately 0.3432 micrometer; therefore, the grain boundary size is increased by approximately 10.81%.

In conclusion, in the method of fabricating a polycrystalline silicon thin film transistor device of the present invention, an amorphous silicon layer can be converted into a polycrystalline silicon layer by using a single thermal process, and dopants in a buffer layer are diffused into the polycrystalline silicon layer for adjusting a threshold voltage to a predetermined range, so that process steps can be simplified and a fabrication cost can be reduced. In addition, when the dopants in the buffer layer are diffused into the polycrystalline silicon layer, the buffer layer is formed into a porous buffer layer, so that in thermal process, thermal energy can accumulate in pores to increase a grain boundary size of polycrystalline silicon in the polycrystalline silicon layer to optimize seed growth, thereby improving electron mobility and device characteristics.

The foregoing provides only preferred embodiments of the present invention, and all equivalent variations and modifications made in accordance with the scope of the present invention shall fall within the coverage of the present invention.

What is claimed is:

1. A polycrystalline silicon thin film transistor device, disposed on a substrate, the polycrystalline silicon thin film transistor device comprising:

a buffer layer, disposed on the substrate, wherein the buffer layer has dopants;

a polycrystalline silicon layer, disposed on the buffer layer, wherein the polycrystalline silicon layer comprises a channel, a source doped region, and a drain doped region, and the source doped region and the drain doped region are respectively located on two sides of the channel;

a gate insulating layer, disposed on the polycrystalline silicon layer; and a gate electrode, disposed on the gate insulating layer, and corresponding to the channel of the polycrystalline silicon layer, wherein the polycrystalline silicon layer is formed by performing a thermal process to convert an amorphous silicon layer into the polycrystalline silicon layer by means of polycrystalization, and simultaneously to out-diffuse a portion of the dopants in the buffer layer into the polycrystalline silicon layer for adjusting a threshold voltage.

2. The polycrystalline silicon thin film transistor device according to claim 1, wherein the dopants in the buffer layer comprises P-type dopants or N-type dopants.

3. The polycrystalline silicon thin film transistor device according to claim 1, wherein the buffer layer is a single-layer-structure buffer layer, and the dopants are located in the single-layer-structure buffer layer.

4. The polycrystalline silicon thin film transistor device according to claim 3, wherein the single-layer-structure buffer layer is a porous buffer layer.

5. The polycrystalline silicon thin film transistor device according to claim 1, wherein the buffer layer is a multi-layered-stack-structure buffer layer, and comprises at least one bottom buffer layer located on the substrate and a top buffer layer located on the at least one bottom buffer layer, and the dopants are located in the top buffer layer of the multi-layered-stack-structure buffer layer.

6. The polycrystalline silicon thin film transistor device according to claim 5, wherein the top buffer layer is a porous buffer layer.

7. The polycrystalline silicon thin film transistor device according to claim 1, further comprising:

an interlevel dielectric layer located on the gate electrode; and a source electrode and a drain electrode located on the interlevel dielectric layer, wherein the source electrode and the source doped region are electrically connected, and the drain electrode and the drain doped region are electrically connected.

8. A method of fabricating the polycrystalline silicon thin film transistor device as claimed in claim 1, the method comprising:

providing the substrate;

forming the buffer layer having the dopants on the substrate;

forming the amorphous silicon layer on the buffer layer having the dopants;

performing the thermal process, to convert the amorphous silicon layer into the polycrystalline silicon layer by means of polycrystalization, and simultaneously to out-diffuse a portion of the dopants in the buffer layer into the polycrystalline silicon layer for adjusting the threshold voltage;

patterning the polycrystalline silicon layer to form an active layer;

forming the gate insulating layer on the active layer;

forming the gate electrode on the gate insulating layer; and forming the source doped region and the drain doped region in the active layer.

9. The method according to claim 8, wherein the dopants in the buffer layer comprise P-type dopants or N-type dopants.

10. The method according to claim 8, wherein the buffer layer is a single-layer-structure buffer layer.

11. The method according to claim 10, wherein before performing the thermal process, the dopants are located in the single-layer-structure buffer layer.

12. The method according to claim 8, wherein the buffer layer is a multi-layered-stack-structure buffer layer, and comprises at least one bottom buffer layer located on the substrate and a top buffer layer located on the at least one bottom buffer layer.

13. The method according to claim 12, wherein before performing the thermal process, the dopants are located in the top buffer layer of the multi-layered-stack-structure buffer layer.

14. The method according to claim 8, wherein the step of forming the buffer layer having dopants on the substrate comprises:

performing a deposition process to deposit the buffer layer on the substrate, and simultaneously introducing a gas that contains the dopants during the deposition process, to form the dopants in the buffer layer.

15. The method according to claim 8, wherein the step of forming the buffer layer having dopants on the substrate comprises:

performing a deposition process to deposit the buffer layer on the substrate; and performing an ion implantation process to form the dopants in the buffer layer.

16. The method according to claim 8, wherein the thermal process comprises an excimer laser annealing (ELA) process.

17. The method according to claim 8, wherein the thermal process comprises a solid phase crystallization (SPC) process.

18. The method transistor device according to claim 8, further comprising:

before performing the thermal process, first performing a dehydrogenation process on the amorphous silicon layer, and simultaneously further diffusing a portion of the dopants in the buffer layer into the amorphous silicon layer.

19. The method according to claim 8, further comprising:

forming an interlevel dielectric layer on the gate electrode; and forming a source electrode and a drain electrode on the interlevel dielectric layer, wherein the source electrode and the source doped region are electrically connected, and the drain electrode and the drain doped region are electrically connected.

* * * * *